United States Patent
Ho et al.

(10) Patent No.: US 9,325,302 B1
(45) Date of Patent: Apr. 26, 2016

(54) PROGRAMMABLE FILTER

(71) Applicant: Lattice Semiconductor Corporation, Hillsboro, OR (US)

(72) Inventors: Vinh Ho, Milpitas, CA (US); Magathi Jayaram, San Jose, CA (US); David Wei, San Jose, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/558,851

(22) Filed: Dec. 3, 2014

(51) Int. Cl.
*H03K 5/00* (2006.01)
*H03K 5/1252* (2006.01)
*H03H 11/04* (2006.01)

(52) U.S. Cl.
CPC .......... *H03K 5/1252* (2013.01); *H03H 11/0405* (2013.01); *H03H 11/0466* (2013.01)

(58) Field of Classification Search
CPC .................................................. H03H 11/0422
USPC ........................... 327/551–559; 708/300–301
See application file for complete search history.

(56) References Cited

U.S. PATENT DOCUMENTS

| | | | | |
|---|---|---|---|---|
| 5,345,273 A | * | 9/1994 | Sun | H04N 5/211 348/607 |
| 6,188,723 B1 | * | 2/2001 | Lee | H04L 25/03834 375/235 |
| 7,532,694 B2 | * | 5/2009 | Hwang | H04B 1/70756 375/349 |
| 7,966,360 B2 | * | 6/2011 | Yomo | H03H 17/0223 708/319 |
| 7,984,092 B2 | * | 7/2011 | Noethlings | H03H 17/0294 708/316 |

* cited by examiner

*Primary Examiner* — Dinh Le

(57) ABSTRACT

In several embodiments of the invention, a programmable architecture for FIR filters includes a tapped delay chain and a number of different slices. Each slice has a multiplexer that receives all of the tapped input-signal samples and a programmable current driver. Each slice can be independently programmed to correspond to any one of the taps in the delay chain, such that zero, one, or more slices can be associated with any of the delay-chain taps. Moreover, the current driver in each slice can be independently programmed to contribute any available driver strength level for the selected tap, where the combination of one or more drive strengths associated with a given tap corresponds to the effective tap coefficient for that tap. In this way, the architecture can be programmed to provide a variety of different filters having not just transfer functions with different coefficient values, but also transfer functions having different numbers of pre-cursor and/or post-cursor taps.

20 Claims, 4 Drawing Sheets

100

200

PROGRAMMABLE FILTER

BACKGROUND

1. Field of the Invention

The present invention relates to electronics and, more specifically, to filters such as finite impulse response (FIR) filters.

2. Description of the Related Art

This section introduces aspects that may help facilitate a better understanding of the invention. Accordingly, the statements of this section are to be read in this light and are not to be understood as admissions about what is prior art or what is not prior art.

FIG. 1 shows a schematic block diagram of a typical implementation of a generic, conventional finite impulse response (FIR) filter 100 that converts an input, serial bitstream 102 into a filtered, output signal 110. The z-domain transfer function H(z) for a discrete-time implementation of FIR filter 100 is given by the following equation:

$$H(z)=Y(z)/X(z)=c_{-m}*z^{-m}+\ldots+c_{-1}*z^{-1}+c_0+c_1*z^1+\ldots+c_n*z^n,$$

where X(z) is the z-domain input signal 102, Y(z) is the z-domain output signal 110, $c_0$ is the current tap coefficient; $c_{-1}, \ldots, c_{-m}$ are the m pre-cursor tap coefficients; and $c_1, \ldots, c_n$ are the n post-cursor tap coefficients. The number m of pre-cursor tap coefficients and the number n of post-cursor tap coefficients will depend on the desired filter characteristics. Note that, depending on the particular filter transfer function, either m or n could be, but do not have to be, zero.

As shown in FIG. 1, the input bitstream 102 is sequentially delayed by a delay chain consisting of (m+n) delays 104. The corresponding delayed 1-bit samples are multiplied by corresponding tap coefficient values $c_{-m}, \ldots, c_n$ at multipliers 106, and the resulting weighted samples are combined at summation node 108 to generate the filtered, output signal 110.

An integrated circuit may need to be able to apply different FIR filters having different transfer functions with different numbers of pre-cursor and/or post-cursor taps to a data stream at different times. For example, for some communications applications, pre-de-emphasis filtering is applied to compensate for losses due to transmit channel characteristics. For such applications, it is desirable to implement transmit drivers having flexible FIR filters to compensate for different channel characteristics.

One conventional solution is to implement the integrated circuit with multiple FIR filters, each one having a different configuration of pre-cursor and post-cursor taps. Another conventional solution is to implement the integrated circuit with a single FIR filter having the maximum number of pre-cursor taps for any supported transfer function and the maximum number of post-cursor taps for any supported transfer function so that any of the different supported transfer functions can be implemented by assigning coefficient values of zero to any taps that are not needed for a particular FIR filter. These conventional solutions are not optimally efficient.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
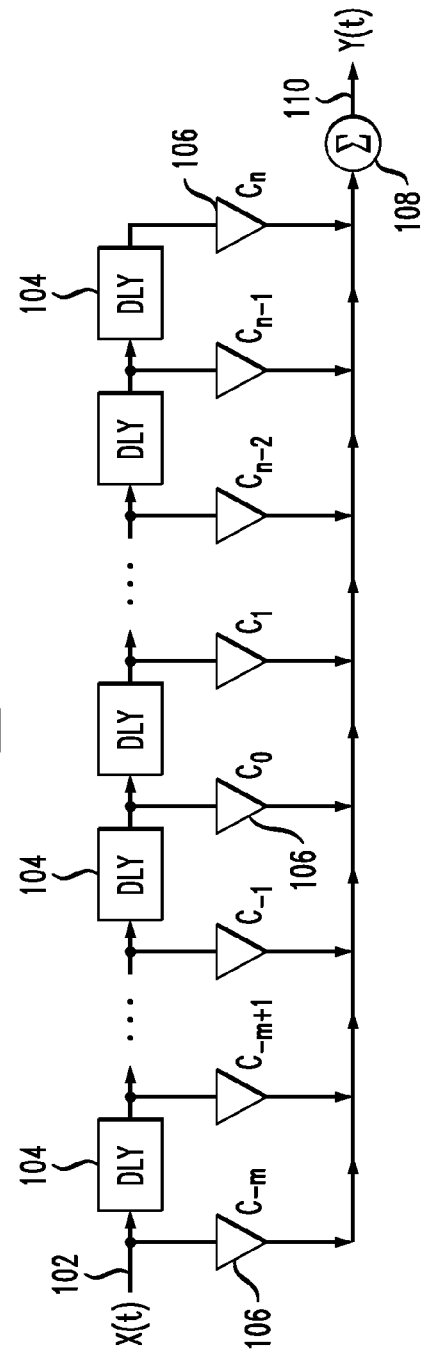
FIG. 1 shows a schematic block diagram of a typical implementation of a conventional finite impulse response (FIR) filter.
Figure 2:
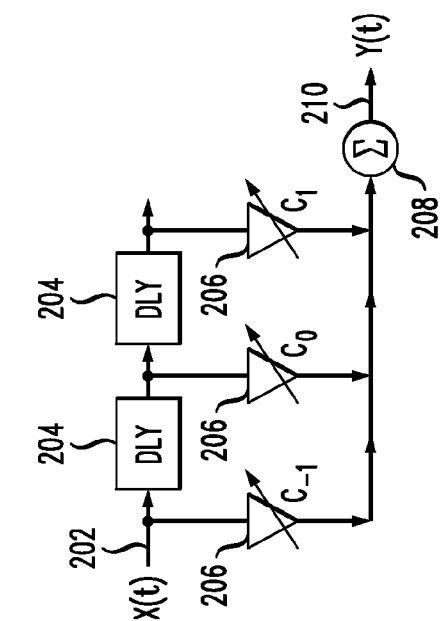
FIG. 2 shows a schematic block diagram of an exemplary three-tap FIR filter of the disclosure.

FIG. 2 shows a schematic block diagram of an exemplary three-tap FIR filter 200 of the disclosure having one pre-cursor tap, one current tap, and one post-cursor tap. Like FIR filter 100 of FIG. 1, FIR filter 200 converts an input bitstream 202 into a filtered output signal 210. Although FIR filter 200 appears to have an architecture similar to that of prior-art FIR filter 100 of FIG. 1, with delays 204 and multipliers 204, as explained below, FIR filter 200 is implemented very differently from FIR filter 100.

Figure 3:
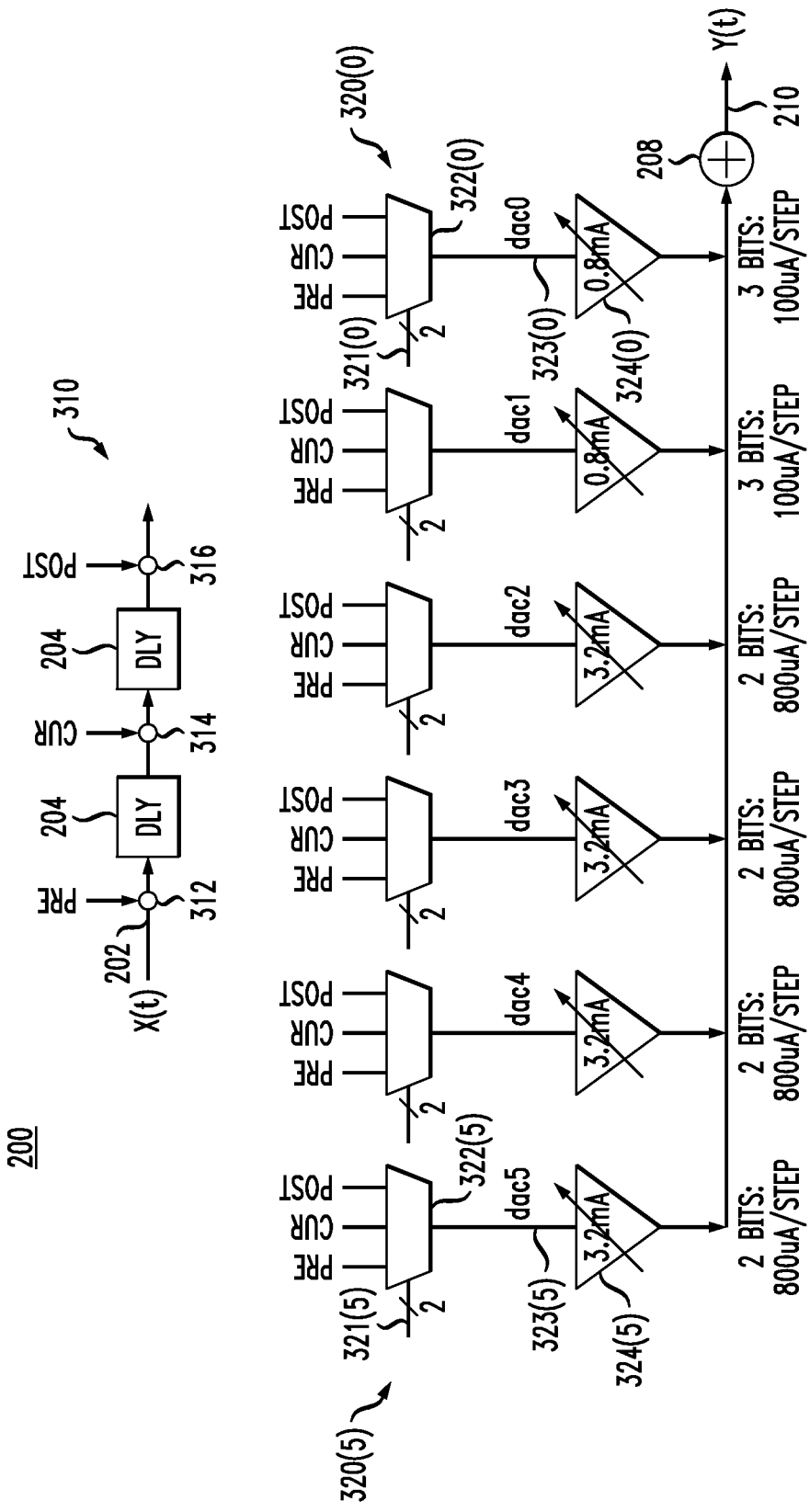
FIG. 3 shows a schematic block diagram of one possible implementation of the FIR filter of FIG. 2.

FIG. 3 shows a schematic block diagram of one possible implementation of FIR filter 200 of FIG. 2. As described further below, FIR filter 200 can implement transfer functions having any combination of (i) zero or one pre-cursor tap, (ii) zero or one current tap, and (iii) zero or one post-cursor tap. In theory, the architecture of FIR filter 200 can be extended to provide FIR filters of the present disclosure that can implement transfer functions having any combination of (i) zero up to any suitable maximum number of pre-cursor taps, (ii) zero or one current tap, and (iii) zero up to any suitable maximum number of post-cursor taps.

FIR filter 200 has a delay chain 310 consisting of the two delays 204 of FIG. 2 and three taps: one pre-cursor tap 312, one current tap 314, and one post-cursor tap 316. Delay chain 310 receives the input, serial bitstream 202 and provides three sample values pre, cur, and post. In one possible implementation, each delay 204 applies a delay of one unit interval (UI). In other possible implementations, each delay 204 applies a delay other than one UI, such as ½ UI or two or more UIs. In some implementations, the magnitude of the delay is programmable.

As shown in FIG. 3, FIR filter 200 has a set of six slices 320(0)-320(5), each slice 320(i) having a 3:1 multiplexer (mux) 322(i) and a programmable current driver 324(i). In addition, FIR filter 200 has summation node 208, which combines the outputs from the six slices 320 to generate the filtered output signal 210.

As shown in FIG. 3, each mux 322(i) (i) receives the three tapped samples pre, cur, and post from the three taps 312, 314, and 316, respectively, of delay chain 310 and (ii) selects one of those three samples based on a 2-bit control signal 3210. The selected sample 3230 is then applied to programmable current driver 324(i). Note that, in this exemplary implementation, current drivers 324(0) and 324(1) each can be independently programmed to drive at any drive strength from a minimum of 0.1 mA to a maximum of 0.8 mA, in eight 0.1 mA increments, while current drivers 324(2)-324(5) each can be independently programmed to drive at any drive strength from a minimum of 0.8 mA to a maximum of 3.2 mA in four 0.8 mA increments. Other implementations may have other current drivers that operate with different maximum currents and/or different increments.

Each slice 320($i$) is independently programmable with regard to both (i) the selection by mux 322($i$) and (ii) the drive strength of current driver 324($i$). As such, zero, one, two, or more slices 320 can be programmed (i.e., configured) to select the pre-cursor sample pre. Similarly, zero, one, two, or more of the remaining slices 320, if any, can be programmed to select the current sample cur. And, lastly, zero, one, two, or more of the remaining slices 320, if any, can be programmed to select the post-cursor sample post. Moreover, each current driver 3240 can be independently programmed to any of its available drive strengths.

In this way, FIR filter 200 can be programmed to implement a variety of different transfer functions consisting of any combination of one, two, or all three of the tapped data samples pre, cur, and post. For example, FIR filter 200 can be programmed to implement the following transfer function:

$$H_1(z) = c_{-1}*z^{-1} + c_0 + c_1*z^1,$$

where each tap coefficient $c_i$ corresponds to the sum of the programmed drive strengths of the different current drivers 324 selected for that tap. Note that FIR filter 200 can also be programmed to implement either of the following two transfer functions:

$$H_2(z) = c_{-1}*z^{-1} + c_0$$

$$H_3(z) = c_0 + c_1*z^1$$

For example, for transfer function $H_2(z)$, none of the muxes 322 would be programmed to select the tap value post. Similarly, for transfer function $H_3(z)$, none of the muxes 322 would be programmed to select the tap value pre. In theory, FIR filter 200 can be programmed to support other transfer functions (e.g., single-tap transfer functions and transfer functions without a current tap) even if those transfer functions might not necessarily be useful.

Note further that all six slices 320 do not have to be used for every transfer function. Any slices 320 that are not needed for a particular transfer function can be turned off, thereby avoiding unnecessary power consumption.

Figure 4:
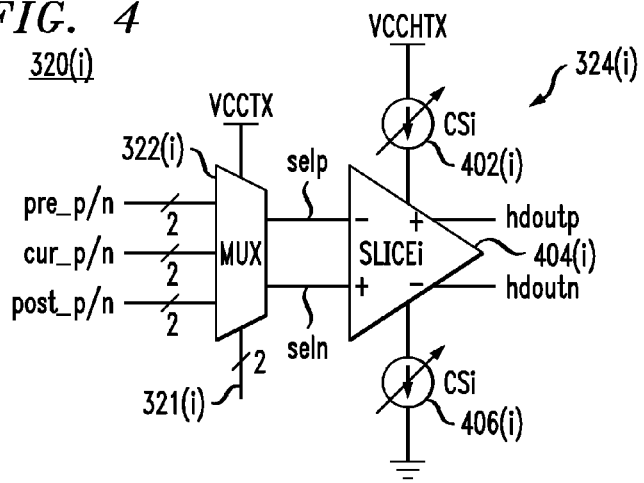
FIG. 4 shows a schematic block diagram illustrating a slice for a differential implementation of the FIR filter of FIGS. 2 and 3.

FIG. 4 shows a schematic block diagram illustrating slice 320($i$) for a differential implementation of FIR filter 200 of FIGS. 2 and 3, in which the input bitstream 202 and the filtered output signal 210 are both differential signals comprising complementary positive and negative components.

As shown in FIG. 4, current driver 3240 is implemented using a differential amplifier 404($i$) connected between a programmable current source 402($i$) and a programmable current sink 406($i$), where each programmable current source/sink can be programmed at a specified current level CSi corresponding to the desired drive strength for that current driver. Although not shown in FIG. 4, current drivers 324(0) and 324(1) of FIG. 3 each receive a dedicated 3-bit control signal that selects one of the eight different available drive strengths from 0.1 mA to 0.8 mA at 0.1 mA increments, while current drivers 324(2)-324(5) of FIG. 3 each receive a dedicated 2-bit control signal that selects one of the four different available drive strengths from 0.8 mA to 3.2 mA in 0.8 mA increments.

As shown in FIG. 4, (6×2) mux 3220 receives three pairs of tapped, complementary samples: (i) pre_p and pre_n from tap 312 of FIG. 3, cur_p and cur_n from tap 314, and post_p and post_n from tap 316 and selects one of those three pairs based on 2-bit control signal 321($i$). Differential amplifier 404($i$) receives the selected pair of complementary samples selp and seln from mux 322($i$) and generates the corresponding amplified, complementary output signals hdoutp and hdoutn (aka filtered signal components) based on the programmed drive current CSi applied by the source and sink current drivers 402($i$) and 406($i$). Although not show in FIG. 4, those two amplified, complementary output signals hdoutp and hdoutn are combined at summation node 208 of FIGS. 2 and 3 with up to five other pairs of amplified, complementary output signals from the other slices 320 of FIR filter 200 to generate the complementary output signal 210.

Figure 5:
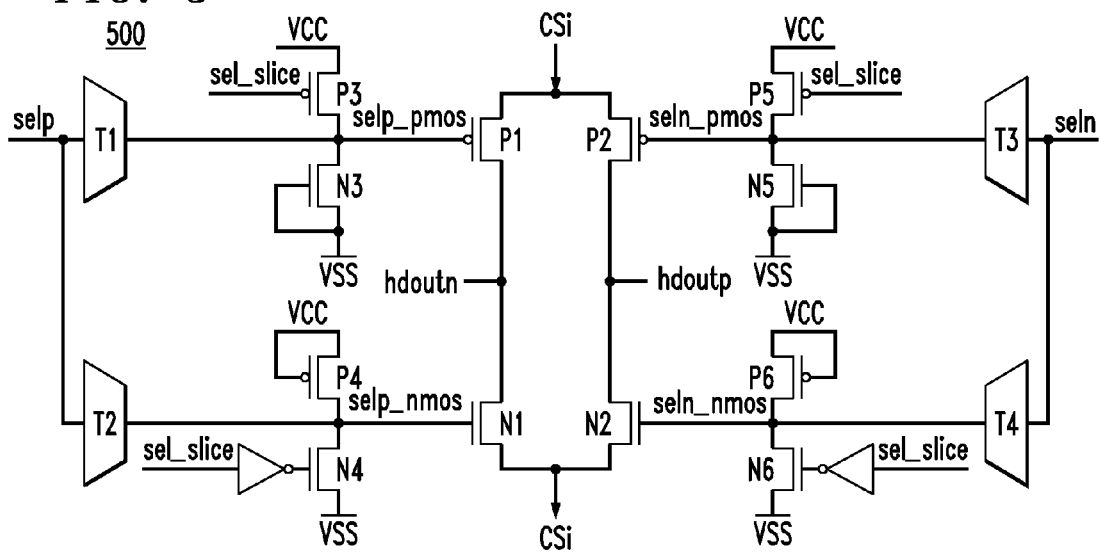
FIG. 5 shows a schematic circuit diagram of a transconductance amplifier that can be used to implement the differential amplifier of FIG. 4.

FIG. 5 shows a schematic circuit diagram of a transconductance amplifier 500 that can be used to implement differential amplifier 404($i$) of FIG. 4. Amplifier 500 has four tri-stated switches, where each tri-stated switch comprises a tri-state buffer (e.g., T1), a pull-up/pull-down cell (e.g., P3/N3), and an MOS switch transistor (e.g., P1).

Figure 6:
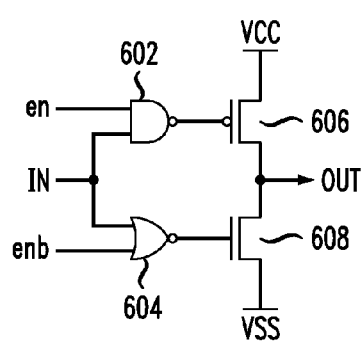
FIG. 6 shows a schematic circuit diagram of a tri-state buffer.

FIG. 6 shows a schematic circuit diagram of a tri-state buffer 600, instances of which can be used to implement each of tri-state buffers T1-T4 of FIG. 5. Tri-state buffer 600 is enabled by setting enable signal en high (i.e., logic 1) and complementary enable signal enb low (i.e., logic 0). With tri-state buffer 600 enabled, when input signal in is high, the output from NAND gate 602 is low and the output from NOR gate 604 is low, which turns on PMOS 606 and turns off NMOS 608, which drives output signal out high. With tri-state buffer 600 enabled, when input signal in is low, the output from NAND gate 602 is high and the output from NOR gate 604 is high, which turns off PMOS 606 and turns on NMOS 608, which drives output signal out low.

Tri-state buffer 600 is disabled by setting enable signal en low and complementary enable signal enb high. With tri-state buffer 600 disabled, when input signal in is high, the output from NAND gate 602 is high and the output from NOR gate 604 is low, which turns off both PMOS 606 and NMOS 608, which leaves output signal out indeterminate. With tri-state buffer 600 disabled, when input signal in is low, the output from NAND gate 602 is again high and the output from NOR gate 604 is again low, which again turns off both PMOS 606 and NMOS 608, which again leaves output signal out indeterminate.

Thus, when tri-state buffer 600 is enabled, output signal out matches input signal in, and, when tri-state buffer 600 is disabled, output signal out is indeterminate independent of the value of input signal in.

To enable slice 320($i$) of FIG. 4, (i) the four tri-state buffers T1-T4 of FIG. 5 are all enabled (i.e., by setting en=1 and enb=0) as described above in reference to FIG. 6 and (ii) the four pull-up/pull-down cells are all disabled by setting sel_slice=1. Setting sel_slice=1, ensures that p-type transistors P3 and P5 are off and that n-type transistors N4 and N6 are also off. Since the gates of n-type transistors N3 and N5 are permanently connected to VSS, and the gates of p-type transistors P4 and P6 are permanently connected to VCC, those four transistors will always be off. In that case, the selected sample selp will be applied to the gates of P1 and N1 as selp_pmos and selp_nmos, respectively, and the complementary selected sample seln will be applied to the gates of P2 and N2 as seln_pmos and seln_nmos, respectively.

With all of the tri-state buffers T1-T4 enabled and all of the pull-up/pull-down cells disabled, when (i) the selected sample selp is high and (ii) the complementary selected sample seln is low, then (iii) selp_pmos and selp_nmos are high, (iv) seln_pmos and seln_nmos are low, (v) p-type transistor P2 and n-type transistor N1 are on, (vi) p-type transistor P1 and n-type transistor N2 are off, (vii) output component hdoutp is driven high at the selected drive strength CSi, and (viii) complementary output component hdoutn is driven low at the selected drive strength CSi. Alternatively, with all of the tri-state buffers T1-T4 enabled and all of the pull-up/pull-down cells disabled, when (i) selp is low and (ii) seln is high, then (iii) selp_pmos and selp_nmos are low, (iv) seln_pmos and seln_nmos are high, (v) P2 and N1 are off, (vi) P1 and N2 are on, (vii) hdoutp is driven low at the selected drive strength CSi, and (viii) hdoutn is driven high at the selected drive strength CSi.

To disable slice $320(i)$ of FIG. 4, (i) the four tri-state buffers T1-T4 of FIG. 5 are all disabled (i.e., by setting en=0 and enb=1) as described above in reference to FIG. 6 and (ii) the four pull-up/pull-down cells are all enabled by setting sel_slice=0. Setting sel_slice=1 turns on transistors P3 and P5 as well as transistors N4 and N6 are also off. In that case, selp_pmos and seln_pmos will both be driven high, and selp_nmos and seln_nmos will both be driven low (independent of the values of selp and seln), thereby ensuring that transistors P1, N1, P2, and N2 will all be off, and that the slice $320(i)$ will be powered down and not draw any current.

The configuration shown in FIG. 5 corresponds to a positive tap coefficient value. The selp and seln inputs can be swapped to achieve a negative tap coefficient value having the same magnitude.

Referring again to FIG. 4, if slice $320(i)$ is not needed for a particular transfer function, then the two-bit mux control signal 3210 is set to the unused value (e.g., 00) to turn off and power down both mux $322(i)$ and current driver 3240. Note that the mux control signal $321(i)$ can be used to generate the control signals sel_slice of FIG. 5 and en and enb of FIG. 6 using appropriate control logic.

Figure 7:
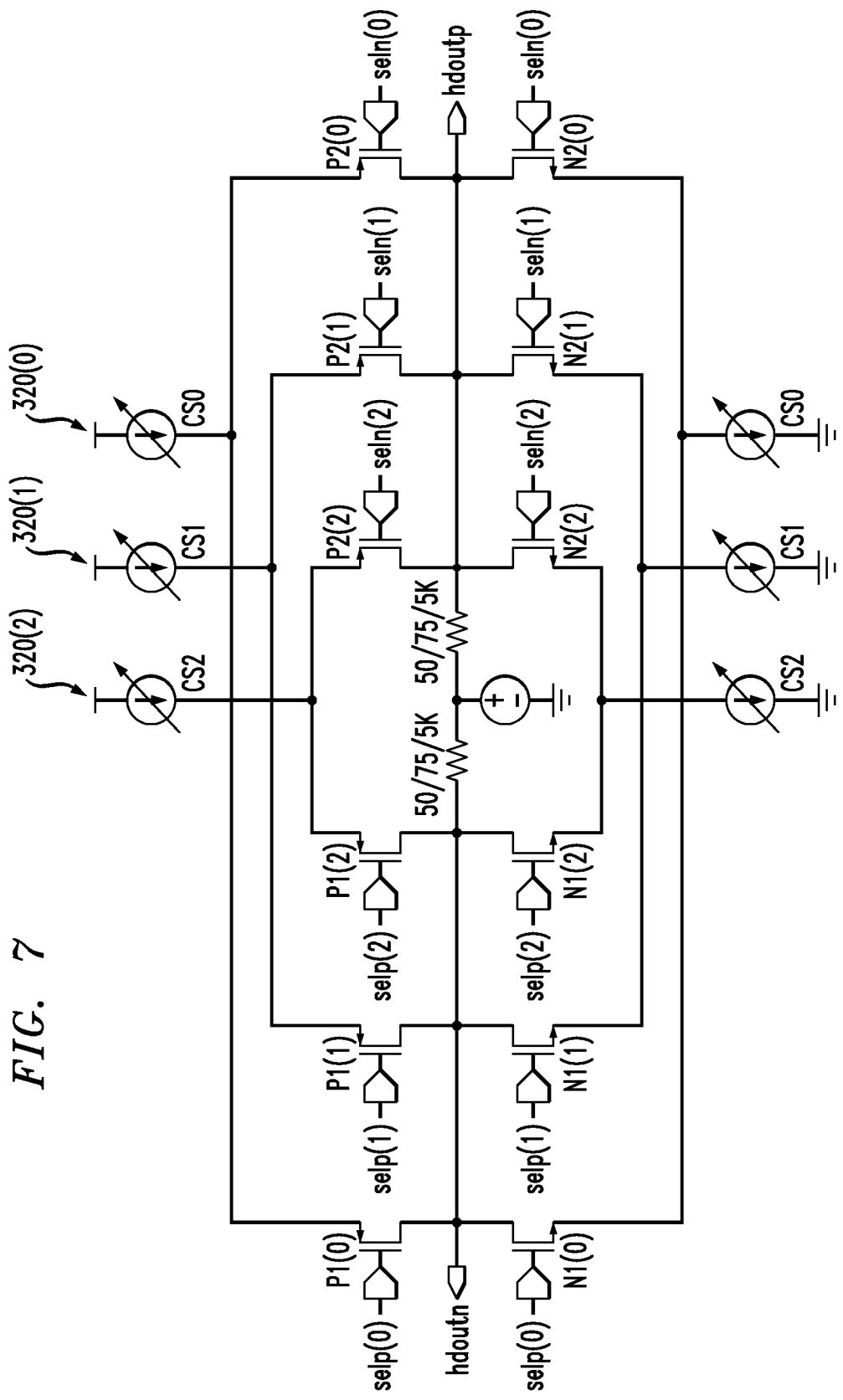
FIG. 7 shows three different slices implemented in a single circuit.

FIG. 7 shows transconductance amplifiers for three slices 320(0)-320(2) implemented in a single circuit. Note that the three slices share the same load, thereby saving power. Although not explicitly shown in FIG. 7, each transistor P1(0)-P1(2), N1(0)-N1(2), P2(0)-P2(2), N2(0)-N2(2) is driven by a tri-state buffer with a pull-up/pull-down cell (as appropriate) as in FIG. 5 to turn on and off independently the different slices. When a slice is not used, it does not add to the load of the other used slices. This implies that the pre-driver needed to drive these slices can be smaller, thereby saving power.

Although the present invention has been described in the context of FIR filter 200 of FIGS. 2 and 3, which can implement transfer functions having up to one pre-cursor tap and up to one post-cursor tap in addition to the current tap, the invention is not so limited. In theory, the present invention can be extrapolated to implement FIR filters having any suitable maximum number of pre-cursor taps and any suitable maximum number of post-cursor taps by:

Implementing a delay chain having an appropriate number of delay elements and taps;
Changing the number of slices; and
Changing the mux ratio for each slice's mux to be based on the total number of taps.

In addition, the variety of different tap coefficient values (i.e., drive current levels) that can be supported by the FIR filters can be changed by implementing suitable programmable current drivers that can be combined to provide those different coefficient values.

FIR filters of this disclosure can provide one or more of the following advantages. By creating a common set of drivers that can be used for any tap (pre, cur, and post), this architecture can utilize less area and less power than prior-art solutions, thereby eliminating the need for dedicated pre-cursor and post-cursor tap drivers. Further, this architecture enables more flexibility when choosing the values for the pre-cursor, current, and post-cursor taps, because all drivers are available to any tap. The modularity of the architecture enables easy insertion or deletion of taps for future products. Using multiple drivers for the same tap enables slew-rate change without affecting the voltage levels of the signal. This architecture can save power by allowing drivers to be turned off completely when not in use.

The unspecified nature of the slices allows them to be used for other pairings. For example, although FIR filter 200 of FIGS. 2 and 3 has been characterized as having one pre-cursor tap, one current tap, and one post-cursor tap, that same configuration can be programmed to function (i) as two pre-cursor taps and one current tap or (ii) as one current tap and two post-cursor taps.

Although embodiments have been described in the context of programmable current drivers, other embodiments may be based on other programmable drivers, such as programmable voltage drivers Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a filter that generates a filtered output signal from an input signal, the filter comprising:
    a delay chain having a plurality of taps that provide a plurality of samples of the input signal;
    a plurality of slices, each slice (i) coupled to receive the plurality of samples and (ii) programmable to select from among the plurality of samples and generate a filtered signal component based on the selection from the plurality of samples; and
    summation circuitry configured to combine the filtered signal components from the plurality of programmable slices to generate the filtered output signal, wherein each slice is independently programmable to correspond to any tap.

2. The filter of claim 1, wherein two or more slices of the plurality of slices are programmable to receive the sample from the same tap of the plurality of taps.

3. The filter of claim 1, wherein each slice of the plurality of slices is programmable with any one of a plurality of available tap coefficient values.

4. The filter of claim 3, wherein at least two different slices of the plurality of slices have two different pluralities of the available tap coefficient values.

5. The filter of claim 1, wherein the filter has more slices than taps.

6. The filter of claim 1, wherein each slice of the plurality of slices is independently programmable to be off.

7. The filter of claim 1, wherein the filter is programmable to implement a transfer function that requires any one of a plurality of selections of taps, from among the plurality of taps.

8. The filter of claim 1, wherein the filter is programmable to implement different transfer functions, wherein the plurality of taps is assigned to provide (i) a current tap, (ii) any of zero, one, or more pre-cursor taps, and (iii) any of zero, one, or more post-cursor taps.

9. The filter of claim 1, wherein the filter is programmable to select any one of a number of different delay increments between pairs of taps of the plurality of taps.

10. The filter of claim 9, wherein the different delay increments comprise one unit interval (UI), wherein a UI is a period of time, one-half UI, and multiple UIs.

11. The filter of claim 1, wherein each slice comprises:
    a multiplexer connected to receive (i) the plurality of input signal samples and (ii) a mux control signal for selecting the input signal sample corresponding to the tap associated with the slice;
    supply current circuitry programmable to generate any one of plurality of different supply current levels; and
    an amplifier connected (i) to the supply current circuitry, (ii) to receive the selected input signal sample from the multiplexer, and (iii) to generate the corresponding filtered signal component.

12. The filter of claim 11, wherein at least one mux control signal value can be used to turn off the slice.

13. The filter of claim 12, wherein turning off the slice comprises powering down the supply current circuitry.

14. The invention of claim 13, wherein:
    two or more slices are programmable to be part of a single tap;
    each slice is programmable with any one of a plurality of available tap coefficient values;
    at least two different slices have two different pluralities of the available tap coefficient values;
    the filter has more slices than taps;
    each slice is independently programmable to be off;
    the filter is programmable to implement a transfer function having any one of a plurality of different numbers of taps; and
    the filter is programmable to implement different transfer functions having (i),a current tap, (ii) any of zero, one, or more pre-cursor taps, and (iii) any of zero, one, or more post-cursor taps.

15. The filter of claim 14, wherein:
    the filter is programmable to have any one of a number of different delay increments; and
    the different delay increments comprise one unit interval (UI), one-half UI, and multiple UIs.

16. A programmable filter comprising:
    a delay chain having a plurality of taps that provide a plurality of samples of an input signal;

a plurality of slices, each slice comprising:
- a multiplexer connected to receive (i) the plurality of samples and (ii) a mux control signal for causing the multiplexer to select a sample from the plurality of samples,
- supply current circuitry, and
- an amplifier coupled (i) to the supply current circuitry, (ii) to receive the selected input signal sample from the multiplexer, and (iii) to generate a respective filtered signal component; and summation circuitry coupled to receive the respective filtered signal components from the plurality of slices and to combine the filtered signal components to produce an output signal.

17. The programmable filter of claim 16, wherein the supply current circuitry of each slice is programmable to generate any one of plurality of different supply current levels.

18. The programmable filter of claim 17, wherein each slice of the plurality of slices is independently programmable with regard to the supply current level of the supply current circuitry.

19. The programmable filter of claim 16, wherein each slice of the plurality of slices is independently programmable with regard to the input signal sample selection by the multiplexer.

20. The programmable filter of claim 16, wherein the filter is a finite impulse response (FIR) filter.

* * * * *